US011066747B2

(12) United States Patent
Liang et al.

(10) Patent No.: US 11,066,747 B2
(45) Date of Patent: Jul. 20, 2021

(54) CHEMICAL DELIVERY CHAMBER FOR SELF-ASSEMBLED MONOLAYER PROCESSES

(71) Applicant: Applied Materials, Inc., Santa Clara, CA (US)

(72) Inventors: Qiwei Liang, Fremont, CA (US); Adib Khan, Santa Clara, CA (US); Tobin Kaufman-Osborn, Sunnyvale, CA (US); Srinivas D. Nemani, Sunnyvale, CA (US); Ludovic Godet, Sunnyvale, CA (US)

(73) Assignee: APPLIED MATERIALS, INC., Houston, TX (US)

(*) Notice: Subject to any disclaimer, the term of this patent is extended or adjusted under 35 U.S.C. 154(b) by 138 days.

(21) Appl. No.: 15/468,758

(22) Filed: Mar. 24, 2017

(65) Prior Publication Data

US 2017/0306491 A1    Oct. 26, 2017

Related U.S. Application Data

(60) Provisional application No. 62/327,194, filed on Apr. 25, 2016.

(51) Int. Cl.
*C23C 16/455*    (2006.01)
*C23C 16/44*    (2006.01)
(Continued)

(52) U.S. Cl.
CPC .... *C23C 16/45565* (2013.01); *C23C 16/4405* (2013.01); *C23C 16/448* (2013.01);
(Continued)

(58) Field of Classification Search
None
See application file for complete search history.

(56) References Cited

U.S. PATENT DOCUMENTS 6,200,893 B1    3/2001  Sneh
6,319,327 B1*  11/2001  Tsukada ............... C23C 16/405
                                                                118/719
(Continued)

FOREIGN PATENT DOCUMENTS

EP    1202321 A2    5/2002
JP    H09-143737 A    6/1997
(Continued)

OTHER PUBLICATIONS

International Search Report and Written Opinion for International application No. PCT/US2017/024077 dated Jul. 11, 2017.
(Continued)

*Primary Examiner* — Binu Thomas
(74) *Attorney, Agent, or Firm* — Patterson + Sheridan LLP; B. Todd Patterson (57) ABSTRACT

Implementations described herein relate to apparatus and methods for self-assembled monolayer (SAM) deposition. Apparatus described herein includes processing chambers having various vapor phase delivery apparatus fluidly coupled thereto. SAM precursors may be delivered to process volumes of the chambers via various apparatus which is heated to maintain the precursors in vapor phase. In one implementation, a first ampoule or vaporizer configured to deliver a SAM precursor may be fluidly coupled to the process volume of a process chamber. A second ampoule or vaporizer configured to deliver a material different from the SAM precursor may also be fluidly coupled to the process volume of the process chamber.

14 Claims, 8 Drawing Sheets

(51) Int. Cl.

| | |
|---|---|
| *C23C 16/448* | (2006.01) |
| *C23C 16/458* | (2006.01) |
| *C23C 16/46* | (2006.01) |
| *C23C 16/505* | (2006.01) |
| *B05D 1/00* | (2006.01) |
| *B05D 1/18* | (2006.01) |

(52) U.S. Cl.
CPC ...... *C23C 16/4412* (2013.01); *C23C 16/4485* (2013.01); *C23C 16/455* (2013.01); *C23C 16/458* (2013.01); *C23C 16/45502* (2013.01); *C23C 16/45591* (2013.01); *C23C 16/46* (2013.01); *C23C 16/505* (2013.01); *B05D 1/185* (2013.01); *B05D 1/60* (2013.01)

(56) References Cited

U.S. PATENT DOCUMENTS

| | | | |
|---|---|---|---|
| 6,391,785 | B1 | 5/2002 | Satta et al. |
| 7,071,022 | B2 | 7/2006 | Couillard et al. |
| 7,648,866 | B2 | 1/2010 | Jung et al. |
| 7,775,508 | B2 | 8/2010 | Choi et al. |
| 7,960,295 | B2 | 6/2011 | Park |
| 9,112,003 | B2 | 8/2015 | Haukka et al. |
| 9,502,289 | B2 | 11/2016 | Haukka et al. |
| 2001/0035127 | A1* | 11/2001 | Metzner ............... C23C 16/407 118/715 |
| 2003/0101938 | A1* | 6/2003 | Ronsse ............... C23C 16/407 118/726 |
| 2004/0221807 | A1 | 11/2004 | Verghese et al. |
| 2006/0096541 | A1* | 5/2006 | Seo .................... C23C 16/34 118/724 |
| 2008/0026146 | A1 | 1/2008 | Kobrin et al. |
| 2008/0044569 | A1 | 2/2008 | Myo et al. |
| 2009/0057266 | A1 | 3/2009 | Tuncel et al. |
| 2010/0304132 | A1* | 12/2010 | Kobrin ............... C23C 16/0272 428/336 |
| 2011/0124187 | A1 | 5/2011 | Afzali-Ardakani et al. |
| 2011/0253044 | A1 | 10/2011 | Tam et al. |
| 2012/0009765 | A1* | 1/2012 | Olgado ............ C23C 16/45508 438/478 |
| 2012/0178650 | A1 | 7/2012 | Carroll et al. |
| 2012/0238109 | A1 | 9/2012 | Hattori et al. |
| 2012/0273052 | A1* | 11/2012 | Ye ..................... C23C 16/4481 137/3 |
| 2013/0193108 | A1 | 8/2013 | Zheng et al. |
| 2014/0357016 | A1 | 12/2014 | Fuse et al. |
| 2014/0370718 | A1 | 12/2014 | Chakrapani et al. |
| 2015/0064838 | A1* | 3/2015 | Logue ................ C23C 16/4485 438/93 |
| 2015/0090330 | A1 | 4/2015 | Sewell et al. |
| 2015/0179500 | A1 | 6/2015 | Boussie et al. |
| 2015/0262869 | A1* | 9/2015 | Naik ................. H01J 37/32357 438/643 |
| 2016/0056071 | A1 | 2/2016 | Draeger et al. |
| 2016/0104648 | A1* | 4/2016 | Park .................. H01L 21/31116 438/9 |

FOREIGN PATENT DOCUMENTS

| | | |
|---|---|---|
| JP | 2013520028 A | 5/2013 |
| JP | 2013-154315 A | 8/2013 |
| JP | 2014531508 A | 11/2014 |
| KR | 10-2010-0107228 | 10/2010 |
| KR | 2011-0014771 A | 2/2011 |
| KR | 10-2013-0005262 A | 1/2013 |
| KR | 10-2014-003040 A | 3/2014 |
| KR | 20140068014 A | 6/2014 |
| KR | 20160022788 A | 3/2016 |
| KR | 20160078428 A | 7/2016 |
| TW | 201204868 A | 2/2012 |
| TW | 201546876 A | 12/2015 |
| WO | 2011103062 A2 | 8/2011 |
| WO | 2013/030576 A1 | 3/2013 |
| WO | 2015/065790 A1 | 5/2015 |

OTHER PUBLICATIONS

SE Kirkwood et al., Mechanism for femtosecond laser pulse patterning of SAM on gold coated substrate, IOP Publishing Ltd 2007 p. 428-430.

Ming Fang, et al., Area-Selective Atomic Layer Deposition: Conformal Coating, Subnanometer Thickness Control and Smart Positioning, ACS Nano 2015 Vo. 9. No. 9 pp. 8651-8654.

Non-final Office Action in U.S. Appl. No. 10/731,656 dated May 11, 2004.

European Office Action in application EP 00955875.0, dated May 8, 2004.

JW Klaus et al., Atomically controlled growth of tungsten and tungsten nitride using sequential surface reactions; Applied Surface Sciences 162-163 (2000) 479-491.

Mikko Ritala et al., Atomic layer epitaxy—a valuable tool for nanotechnology?; Nanotechnology 10 (1999) 19-24 printed in the UK.

Per Martensson et al., Atomic Layer Epitaxy of Copper, J. Elect rochem. Soc., vol. 145, No. 8, Aug. 1998 The Electrochemical Society, Inc. pp. 2926-2931.

Shin Yokoyama, et al., Atomic-layer selective deposition of silicon nitride on hydrogen-terminated Si surfaces, Applied Surface Science 130-132 1998. 352-356.

Stephen M. Gates, Surface Chemistry in the Chemical Vapor Deposition of Electronic Materials, Chem. Rev. 1996, 96, pp. 1519-1532.

A. Jain et al., Control of selectivity during chemical vapor deposition of copper from copper (I) compounds via silicon dioxide surface modification, Applied Physics Letters 61, pp. 2662-2664 (1992) American Institute of Physics.

M. Leskela et al., ALD precursor chemistry: Evolution and future challenges, Article published online by EDP Sciences and available at http://dx_doi.org/10.1051/jp4:19998106.

Jae-Sik Min et al., Metal-organic atomic-layer deposition of titanium-silicon-nitride films. Applied Physics Letters vol. 75, No. 11 Sep. 13, 1999.

Mikko Ritala et al., Perfectly Conformal TiN and Al2O3 Films Deposited by Atomic Layer Deposition, Chemical Vapor Deposition 1999, 5, No. 1 Ó Wiley-VCH Verlag GmbH, D-69469 Weinheim, 1999.

T. M. Mayer, et al., Chemical Vapor Deposition of Fluoroalkylsilane Monolayer Films; for Adhesion Control in Microelectromechanical Systems, Journal of Vacuum Science & Technology B, 18 (5), Sep./Oct. 2000, 9 pages.

Elina Färm, et al., Self-Assembled Octadecyltrimethoxysilane Monolayers Enabling Selective-Area Atomic Layer Deposition of Iridium, Chemical Vapor Deposition, 12, 2006, 3 pp.

Junsic Hong, et al., ALD Resist Formed by Vapor-Deposited Self-Assembled Monolayers, Langmuir 2007, 23, 6 pp.

Satu Ek, et al., Atomic Layer Deposition of a High-Density Aminopropylsiloxane Network on Silica through Sequential Reactions of ?-Aminopropyltrialkoxysilanes and Water, Langmuir 2003, 19, 9 pp.

International Search Report and Written Opinion for International Application No. PCT/US2017/019982 dated Jun. 26, 2017.

Woo-Hee Kim, et al., A Process for Topographically-Selective Deposition on 3D Nanostructures by Ion Implantation, ACS Nano, 2016, 10 (4), 22 pp.

Hashemi et al, Self Correcting Process for High Quality Patterning by Atomic Layer Deposition, American Chemical Society, Jul. 16, 2015.

Elina Farm, Selective-Area Atomic Layer Deposition, University of Helsinki, Nov. 2011.

Office Action for Taiwan Application No. 106113223 dated Jul. 9, 2019.

Search Report for Taiwan Application No. 106113223 dated Jul. 8, 2019.

(56) References Cited

OTHER PUBLICATIONS

Communication pursuant to Rule 164(1) EPC for Application No. 17790059.4-1103 /3449500 dated Dec. 9, 2019.
Office Action for Korean Application No. 10-2018-7033883 dated Feb. 17, 2020.
Office Action for Japanese Application No. 2018-555679 dated Dec. 24, 2019.
Office Action for Korean Application No. 10-2018-7028591 dated Dec. 12, 2019.
Office Action for Japanese Application No. 2018-546484 dated Oct. 8, 2019.
Extended European Search Report for European Application No. 17790059.4 dated Mar. 19, 2020.
Japanese Office Action dated May 12, 2020 for Application No. 2018-555679.
Final Office Action for Korean Application No. 10-2018-7033883 dated Jun. 17, 2020.
Final Office Action for Korean Application No. 10-2018-7033883 dated Aug. 13, 2020 (w/ translation), 9 pages.
Notice of Grant for Taiwan Application No. 109113612 dated Nov. 19, 2020.
Search Report for Taiwan Application No. 109113612 dated Nov. 18, 2020.
Korean Office Action for Application No. 10-2021-70000275 dated Feb. 1, 2021.

* cited by examiner

CHEMICAL DELIVERY CHAMBER FOR SELF-ASSEMBLED MONOLAYER PROCESSES

CROSS-REFERENCE TO RELATED APPLICATIONS

This application claims benefit of U.S. Provisional Patent Application No. 62/327,194, filed Apr. 25, 2016, the entirety of which is herein incorporated by reference.

BACKGROUND

Field

Implementations of the present disclosure generally relate to apparatus for processing substrates. More specifically, implementations described herein relate to a chemical delivery chamber for self-assembled monolayer processes.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials gains importance.

Self-assembled monolayers (SAMs) may be utilized as a masking material to improve subsequent material deposition selectivity. SAMs are generally surface chemistry dependent and can be formed preferentially on various materials. However, current apparatus for depositing SAMs often suffer from slow deposition rates and the ability to reliably deliver SAMs in a vapor state to a process volume for deposition on a substrate. For example, current vapor deposition systems deliver the SAM molecule at very low pressures (e.g., 2 mTorr) using the vapor pressure of a heated SAM molecule solution to expose the chemistry to the substrate. This low vapor pressure results in low concentration in the gas phase and is time intensive, taking several days in certain examples. Thus, it takes a significant time to form dense high quality SAM films without pinholes.

Thus, what is needed in the art are improved apparatus for substrate processing.

SUMMARY

In one implementation, a substrate processing apparatus is provided. The apparatus includes a chamber body defining a process volume, a substrate support disposed within the process volume, and a showerhead disposed opposite the substrate support. A lid plate may be coupled to the chamber body, a backing plate may be disposed between the lid plate and the showerhead, and an injection assembly may be coupled to the lid plate opposite the backing plate. The injection assembly may be in fluid communication with the process volume via the backing plate and the showerhead. A first vapor generation assembly may be in fluid communication with the injection assembly and the first vapor generation assembly may be configured to deliver a self-assembled monolayer (SAM) precursor to the process volume in a vapor state. A first heated delivery conduit may be disposed between the first vapor generation assembly and the injection assembly. A second vapor generation assembly may be in fluid communication with the injection assembly and the second vapor generation assembly may be configured to deliver a co-reactant to the process volume in a vapor state. A second heated delivery conduit may be disposed between the second vapor generation assembly and the injection assembly.

In another implementation, a substrate processing apparatus is provided. The apparatus includes a chamber body defining a process volume, a substrate support disposed in the process volume, and a heater disposed in the process volume opposite the substrate support. A manifold may be coupled to the chamber body and the manifold may extend into the process volume between the substrate support and the heater. A lid plate may be coupled to the chamber body and the heater may be disposed between the substrate support and the lid plate. A fluid conduit may extend through the lid plate and the manifold radially outward of the heater and a vapor generation assembly may also be coupled to the chamber body. The vapor generation assembly includes an injector in fluid communication with the process volume via the fluid conduit. An exhaust port may be disposed in the manifold opposite the injector and a vapor injected into the process volume may flow from the injector to the exhaust port.

In yet another implementation, a substrate processing apparatus is provided. The apparatus includes a chamber body defining a process volume, a substrate support disposed in the process volume, and a heater disposed in the process volume opposite the substrate support. A lid plate may be coupled to the chamber body and the heater may be disposed between the substrate support and the lid plate. A vapor generation assembly may be coupled to a center region of the lid plate and the vapor generation assembly may include an injector in fluid communication with the process volume. A SAM precursor source may be in fluid communication with the process volume via the vapor generation assembly and a co-reactant precursor source may also be in fluid communication with the process volume via the vapor generation assembly.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate exemplary implementations and are therefore not to be considered limiting of its scope, may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein relate to apparatus and methods for self-assembled monolayer (SAM) deposition. Apparatus described herein includes processing chambers having various vapor phase delivery apparatus fluidly coupled thereto. SAM precursors may be delivered to process volumes of the chambers via various apparatus which is heated to maintain the precursors in vapor phase. In one implementation, a first ampoule or vaporizer configured to deliver a SAM precursor may be fluidly coupled to the process volume of a process chamber. A second ampoule or vaporizer configured to deliver a material different from the SAM precursor may also be fluidly coupled to the process volume of the process chamber.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

As utilized herein, "self-assembled monolayer" (SAM) generally refers to a layer of molecules that are attached (e.g., by a chemical bond) to a surface and that have adopted a preferred orientation with respect to that surface and even with respect to each other. The SAM typically includes an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain in which a tail or "terminal end" can be functionalized, for example, to vary wetting and interfacial properties. The molecules that form the SAM will selectively attach to one material over another material (e.g., metal vs. dielectric) and if of sufficient density, can successfully operation subsequent deposition allowing for selective deposition on materials not coated with the SAM.

Figure 1:
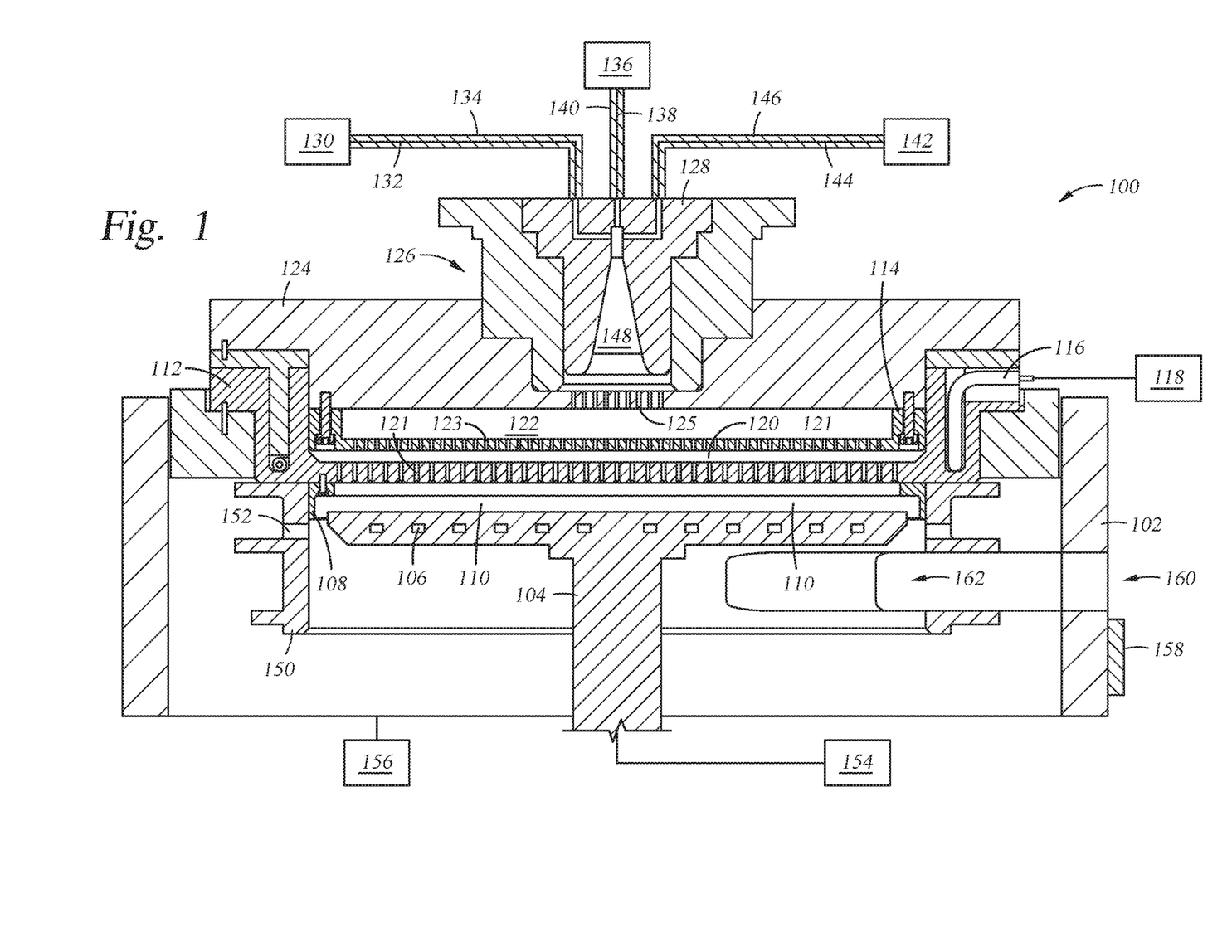
FIG. 1 illustrates a cross-sectional view of a processing chamber according to one implementation described herein.

FIG. 1 illustrates a cross-sectional view of a processing chamber 100 according to one implementation described herein. The chamber 100 includes a chamber body 102 which defines a process volume 110. A substrate support 104 may be disposed in the process volume 110 and a showerhead 112 may be disposed opposite the substrate support 104. A pumping liner 150 may be coupled to the chamber body 102 and may disposed radially outward of the substrate support 104. A lid plate 124 may be coupled to the showerhead 112 and supported by the chamber body 102. A backing plate 114 may be disposed between the showerhead 112 and the lid plate 124. An injection assembly 126 may be coupled to the lid plate 124 and the injection assembly may be in fluid communication with the process volume 110.

The chamber body 102 may be manufactured from a material suitable to withstand temperatures of up to about 300° C. For example, the chamber body 102 may be formed from aluminum, alloys thereof, stainless steel, and other suitable metallic materials. A slit valve opening 160 may be formed in the chamber body 102 to allow for ingress and egress of a substrate to and from the process volume 110. A slit valve door 158 may be coupled to the chamber body 102 and may be moveable to seal and unseal the slit valve opening 160. In one implementation, the slit valve door 158 may be formed from the same materials as the chamber body 102. Alternatively, the slit valve door 158 may be formed from materials different form the chamber body 102.

The substrate support 104 may be moveably disposed within the process volume 110. As illustrated, the substrate support 104 is disposed in an elevated processing position. The substrate support 104 may be lowered such that a substrate supporting surface of the substrate support 104 is coplanar with or below the slit valve opening 160 to allow for positioning of a substrate on the substrate support 104. The substrate support may be formed from a material suitable for operation at elevated processing temperatures and may be a metallic material, a ceramic material, or combinations thereof. For example, the pedestal may be formed from aluminum, aluminum alloys, stainless steel, or ceramic materials, such as aluminum oxide or aluminum nitride.

The substrate support 104 may have a heating member 106 disposed therein and the heating member 106 may be coupled to a power source 154. The power source 154 may also provide power for raising and lowering the substrate support 104 within the process volume 110. The heating member 106 may be a resistive heater or the like and may be disposed within the substrate support 104 in any desirable orientation. For example, the heating member 106 may be formed in the substrate support 104 in a spiral orientation or other suitable orientation configured to heat the substrate support uniformly, such as a tortured path orientation. In one implementation, the heating member 106 may be configured to heat the substrate support 104 to a temperature between about 100° C. and about 300° C.

The pumping liner 150 is sized to surround the substrate support 104 and the process volume 110. Similar to the substrate support 104, the pumping liner 150 may be formed from metallic materials, ceramic materials, or combinations thereof. For example, the pedestal may be formed from aluminum, aluminum alloys, stainless steel, or ceramic materials, such as aluminum oxide or aluminum nitride. The pumping liner 150 may have an opening 162 formed therein to allow for ingress and egress of a substrate into the process volume 110. The opening 162 may be positioned substantially co-planar with the slit valve opening 160. A plurality of holes 152 may be formed along an inner diameter of the pumping liner 150. The plurality of holes 152 provide for evacuation of gases and other materials from the process volume 110 to an exhaust. Accordingly, the process volume 110 is in fluid communication with the exhaust 156 via the holes 152 of the pumping liner 150.

The showerhead 112, which is disposed opposite the substrate support 104, may be coupled directly or indirectly to and supported by the chamber body 102. The showerhead 112 may be formed from materials similar to the materials utilized for the substrate support 104 and the pumping liner 150. The showerhead 112 may have a plurality of first passages 121 formed therein which extend from the process volume 110 to a first plenum 120 formed between the showerhead 112 and the backing plate 114. The first passages 121 enable fluid communication and the transfer of vapor from the first plenum 120 to the process volume 110.

A showerhead liner 108 may also be disposed in the process volume 110. The showerhead liner 108 may be formed from the same or similar materials as the showerhead 112 and the showerhead liner may be coupled to the showerhead 112. In one implementation, the showerhead liner 108 is a ring-like body. The showerhead liner 108 may have an inner diameter which is substantially similar to an outer diameter of the substrate support 104. The inner diameter of the showerhead liner 108 may also be sized such that the innermost surface of the showerhead liner 108 is radially outward of the first passages 121 in order to not interfere with vapor delivery to the process volume 110. The showerhead liner 108 occupies physical space within the process volume 110 and reduces the volume of the process volume 110, thereby reducing the amount of SAM precursor needed to form SAM molecules on a substrate. Thus, efficiency of a SAM formation process may be increased.

The showerhead 112 may also have a heater 116 disposed therein. The heater 116 may be may be a resistive heater of the like and may be disposed within the showerhead 112 radially outward of the first passages 121. In one implementation, the heater 116 may be disposed within the showerhead 112 in a circumferential orientation which substantially surrounds the first passages 121. The heater 116 may be coupled to a power source 118 to enable resistive heating of the showerhead 112. In one implementation, the showerhead 112 may be configured to be heated to a temperature between about 150° C. and about 250° C.

The backing plate 114, which is disposed between the showerhead and the lid plate 124, and partially defines the first plenum 120, may have a second plurality of passages 123 disposed therein. A second plenum 122 may be formed between the backing plate 114 and the lid plate 124. The passages 123 enable the second plenum 122 to be in fluid communication with the first plenum 120. A third plurality of passages 125 may be formed in the lid plate 124 between the second plenum 122 and the injection assembly 126.

The injection assembly 126 is configured to deliver vaporized materials to the process volume 110. In operation, vaporized materials, such as SAM precursors and/or co-reactant precursors, are delivered from the injection assembly 126 through the third plurality of passages 125 to the second plenum 122. The vaporized materials travel through the second plurality of passages 123 of the backing plate 114 to the first plenum 120 and through the first plurality of passages 121 of the showerhead 112 to the process volume 110. After processing of a substrate, the vaporized materials and other effluent may be removed from the process volume 110 through the holes 152 of the pumping liner 150 via the exhaust 156.

The injection assembly 126 includes a housing 127 coupled to the lid plate 124 and an injector 128 coupled to the housing 127. The injector 128 may be disposed within the housing 127 and the injector 128 may include a third plenum 148. In one implementation, the third plenum 148 may be funnel shaped. The shape of the third plenum 148 may be configured to facilitate and encourage mixing of vaporized materials prior to delivery to the process volume 110. Although the third plenum 148 is illustrated as a funnel shape, other shapes which facilitate mixing of vaporized materials are contemplated.

A first ampoule 130 may be coupled to the injection assembly 126 via a first conduit 132. More specifically, the first ampoule 130 may be in fluid communication with the third plenum 148 of the injector 128 via the first conduit 132. The first conduit 132 may extend from the first ampoule 130 to the third plenum 148. A first heater jacket 134 may surround the first conduit 132 on portions of the first conduit 132 disposed beyond the injector 128. In one implementation, the first heater jacket 134 may be resistively heated to maintain a temperature of the first conduit 132 between about 50° C. and about 250° C.

The first ampoule 130 is configured to vaporize and deliver SAM precursors to the process volume 110. Examples of suitable SAM precursors which may be utilized in accordance with the implementations described herein include the materials described hereinafter, including combinations, mixtures, and grafts thereof, in addition to other SAM precursor materials having characteristics suitable for blocking deposition of subsequently deposited materials in a semiconductor fabrication process. In one implementation, the SAM precursors may be carboxylic acid materials, such as methylcarboxylic acids, ethycarboxylic acids, propylcarboxylic acids, butylcarboxylic acids, pentylcarboxylic acids, hexylcarboxylic acids, heptylcarboxylic acids, octylcarboxylic acids, nonylcarboxylic acids, decylcarboxylic acids, undecylcarboxylic acids, dodecylcarboxylic acids, tridecylcarboxylic acids, tetradecylcarboxylic acids, pentadecylcarboxylic acids, hexadecylcarboxylic acids, heptadecylcarboxylic acids, octadecylcarboxylic acids, and nonadecylcarboxylic acids.

In one implementation, the SAM precursors may be phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, and nonadecylphosphonic acid.

In another implementation, the SAM precursors may be thiol materials, such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, and nonadecanethiol.

In another implementation, the SAM precursors may be silylamine materials, such as tris(dimethylamino)methylsilane, tris(dimethylamino)ethylsilane, tris(dimethylamino) propylsilane, tris(dimethylamino)butylsilane, tris(dimethylamino)pentylsilane, tris(dimethylamino)hexylsilane, tris (dimethylamino)heptylsilane, tris(dimethylamino) octylsilane, tris(dimethylamino)nonylsilane, tris (dimethylamino)decylsilane, tris(dimethylamino) undecylsilane tris(dimethylamino)dodecylsilane, tris (dimethylamino)tridecylsilane, tris(dimethylamino) tetradecylsilane, tris(dimethylamino)pentadecylsilane, tris (dimethylamino)hexadecylsilane, tris(dimethylamino) heptadecylsilane, tris(dimethylamino)octadecylsilane, and tris(dimethylamino)nonadecylsilane.

In another implementation, the SAM precursors may be chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

In another embodiment, the SAM precursors may be oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltrethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltroethoxysilane, heptadecyltrimethoxysilane, heptadecyltriethoxysilane, octadecyltrimethoxylsilane octadecyltriethoxysilane, nonadecyltrimethoxysilane, and nonadecyltriethoxysilane.

In another implementation, the SAM precursors may have a fluorinated R group, such as (1,1,2,2-perfluorodecyl) trichlorosilane, trichloro(1,1,2,2-perfluorooctyl)silane, (trideca-fluoro-1, 1,2,2-tetrahydrooctyl)trichlorosilane, (tridecafluoro-1, 1,2,2-tetrahydro-octyl)triethoxysilane, (tridecafluoro-1, 1,2,2-tetrahydrooctyl)methyldichlorosilane, (tridecafluoro-1, 1,2,2-tetrahydrooctyl)dimethylchlorosilane, and (heptadecafluoro-1, 1,2,2-tetrahydrodecyl) trichlorosilane, among others.

A second ampoule 136 may be coupled to the injection assembly 126 via a second conduit 138. More specifically, the second ampoule 136 may be in fluid communication with the third plenum 148 of the injector 128 via the second conduit 138. The second conduit 138 may extend from the second ampoule 136 to the third plenum 148. A second heater jacket 140 may surround the second conduit 138 on portions of the second conduit 138 disposed beyond the injector 128. In one implementation, the second heater jacket 140 may be resistively heated to maintain a temperature of the second conduit 138 between about 50° C. and about 250° C.

The second ampoule 136 is configured to vaporize and deliver co-reactant precursors to the process volume 110. Suitable examples of co-reactant precursors include hydroxyl moiety materials, such as ambient air, water solution or vapor, hydrogen peroxide solution or vapor, organic alcohol solutions or vapors, such as methanol, isopropanol, ethanol, and diols, among others. Hydrogen gas and oxygen gas may also be utilized in combination to form hydroxyl moieties. It is contemplated that other non-hydroxyl moiety precursors may also be utilized in accordance with the implementations described herein. Non-hydroxyl moiety precursors may include nitrogen gas, (di)isocyanates, hydrogen sulfide, and ammonia, among others.

In one implementation, a cleaning gas source 142 may be coupled to the injection assembly 126 via a third conduit 144. More specifically, the cleaning gas source 142 may be in fluid communication with the third plenum 148 of the injector 128 via the third conduit 144. The third conduit 144 may extend from the cleaning gas source 142 to the third plenum 148. A third heater jacket 146 may optionally surround the third conduit 144 on portions of the third conduit 144 disposed beyond the injector 128. In one implementation, the third heater jacket 146 may be resistively heated to maintain a temperature of the third conduit 144 between about 50° C. and about 250° C. Gases provided by the cleaning gas source 142 may include chlorine containing materials, fluorine containing materials, and other materials suitable for cleaning components of the processing chamber 100.

In another implementation, the cleaning gas source 142 may be a remote plasma source. In this implementation, the remote plasma source may energize cleaning gas to generate radicals and/or ions and the deliver the plasma products to the process volume 110. In one implementation, the remote plasma source may be optional.

In another implementation, the cleaning gas source 142 may be a carrier gas source. A carrier gas may be utilized to facilitate delivery of vapor phase SAM precursors and the carrier gas, depending on the process volume 110, may be delivered at a flow rate suitable to facilitate transport of the SAM precursors from the third plenum 148, through the third passages 125, through the second plenum 122 and the second passages 123, and through the first plenum 120 and the first passages 121 to the process volume 110. Suitable carrier gases include gases, such as noble gases or the like, that are generally inert under SAM adsorption conditions that facilitate delivery of the SAM molecules to surfaces of the substrate.

The heated showerhead 112 and the heated substrate support 104 may heat the process volume 110 to a temperature of between about 50° and about 250° C. The ampoules 130, 136 and conduits 132, 138 may be heated to similar temperatures. The showerhead liner 108, backing plate 114, lid plate 124, and injection assembly 126 may also be conductively heated by the showerhead 112. The temperature of the flow path along which the SAM precursors travel is maintained at an elevated temperature to prevent condensation of the vaporized SAM precursors on the various apparatus. The process volume 110 may also be maintained at a pressure of less than about 600 Torr which may also facilitate maintenance of the vapor state of the SAM precursor and co-reactant precursor.

In an operational implementation, the SAM precursor may be continually flowed through the process volume 110 from the first ampoule 130 to the exhaust 156. In this implementation, the pressure of the process volume 110 may be maintained in an isobaric state. In another implementation, the SAM precursor may fill the process volume 110 and be maintained in the process volume 110 for a period of time prior to being exhausted from the process volume 110. In another implementation, co-reactant precursors may be continually flowed to the process volume 110 or provided in a discontinuous manner, such as pulsing. In another implementation, the SAM precursor and the co-reactant precursor may be provided to the process volume 110 in an alternating manner either continually or statically.

Figures 2A, 2B:
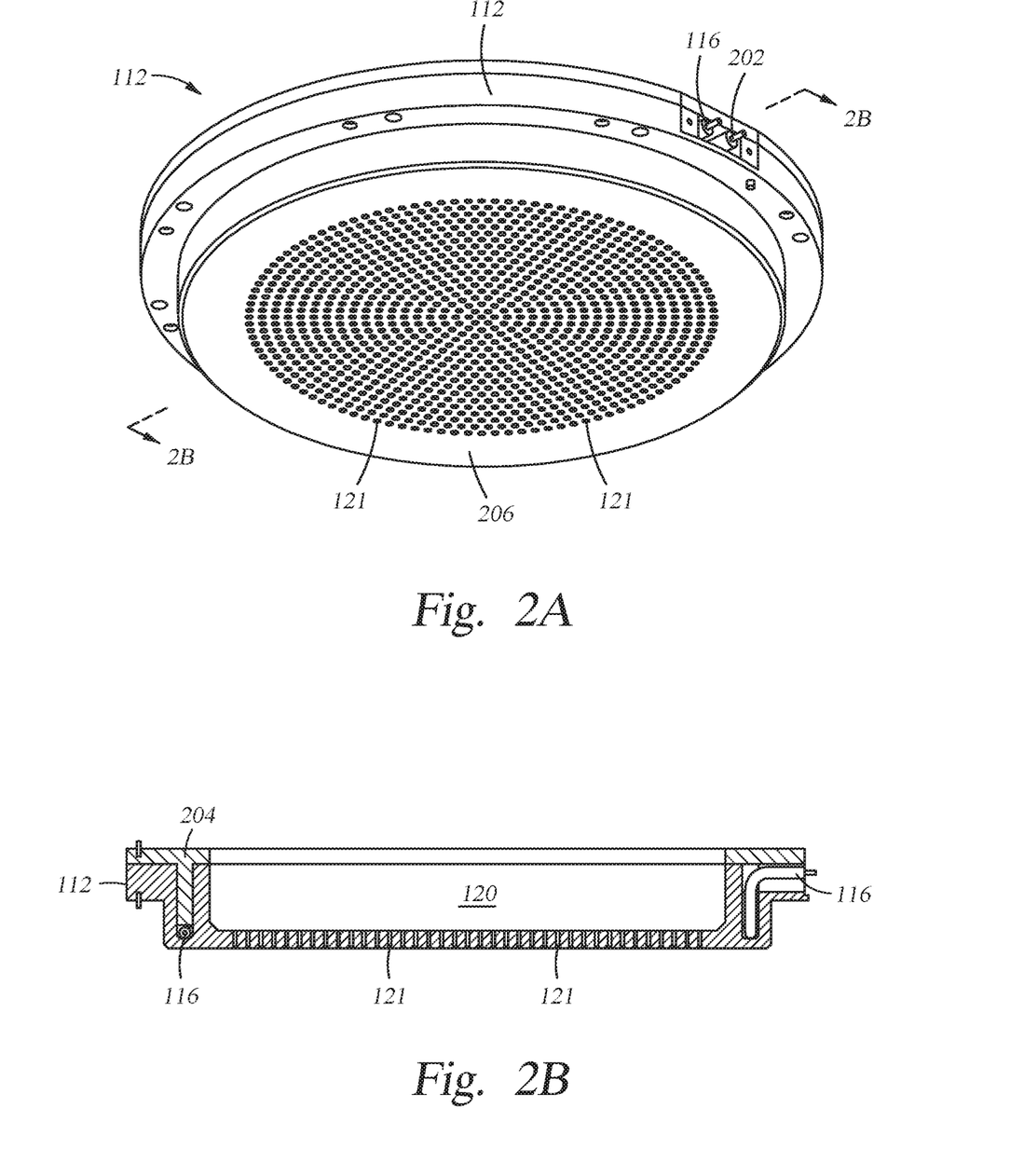
FIG. 2A illustrates a perspective view of a showerhead of the processing chamber of FIG. 1 according to one implementation described herein.
FIG. 2B illustrates a cross-sectional view of the showerhead of FIG. 2A taken along line 2B-2B according to one implementation described herein.

FIG. 2A illustrates a perspective view of the showerhead 112 of FIG. 1 according to one implementation described herein. In the illustrated orientation, a surface 206 of the showerhead which has the first passages 121 formed therein is the surface which is positioned adjacent and at least partially defining the process volume 110. Also illustrated is the heater 116 extending from the showerhead 112. A connection member 202, such as a thermally or electrically conductive wire or the like, may extend from the heater 116 to the power source 118 (not illustrated).

FIG. 2B illustrates a cross-sectional view of the showerhead 112 of FIG. 2A taken along line 2B-2B according to one implementation described herein. In the illustrated implementation, the heater 116 is disposed within the showerhead 112. Voids may be machined in the body of the showerhead 112 and the heater 116 may be inserted into the showerhead 112. After insertion or placement of the heater 116, a cap 204 may be coupled to the showerhead 112 opposite the surface 206. The cap 204 may encase the heater 116 within the showerhead 112 and prevent the heater 116 from being exposed to various processing environments.

Figure 3A:
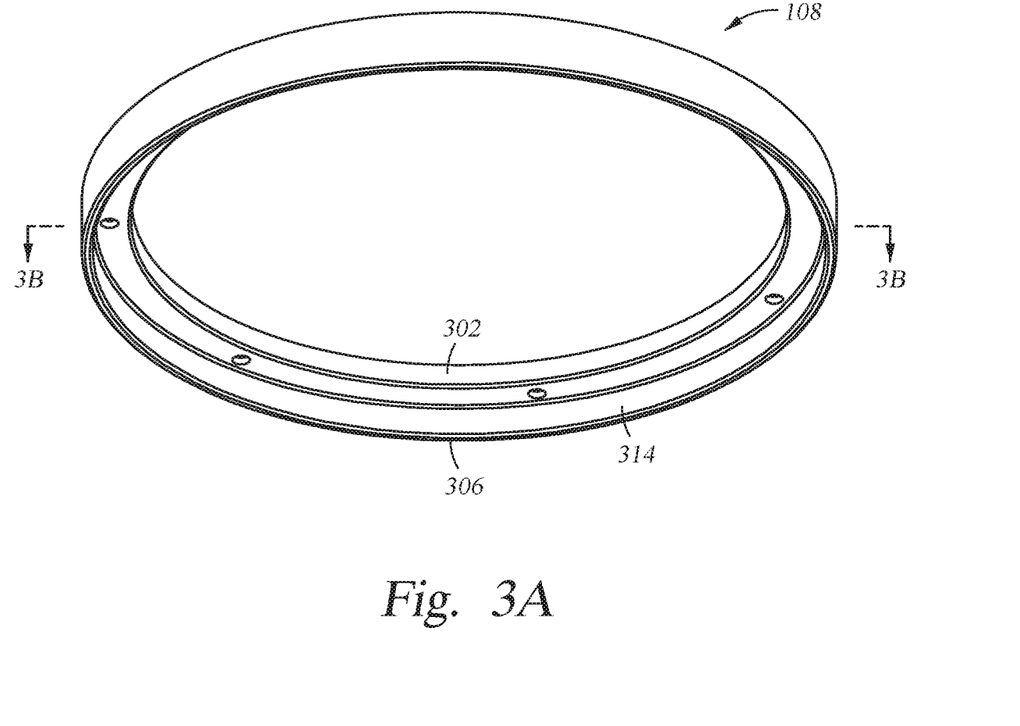
FIG. 3A illustrates a perspective view of a showerhead liner of the processing chamber of FIG. 1 according to one implementation described herein.

FIG. 3A illustrates a perspective view of the showerhead liner 108 according to one implementation described herein. As illustrated, the showerhead liner 108 is predominantly ring-shaped. It is contemplated that various other implementations of geometric shape may be utilized, such as annular, oblong, and polygonal.

Figure 3B:
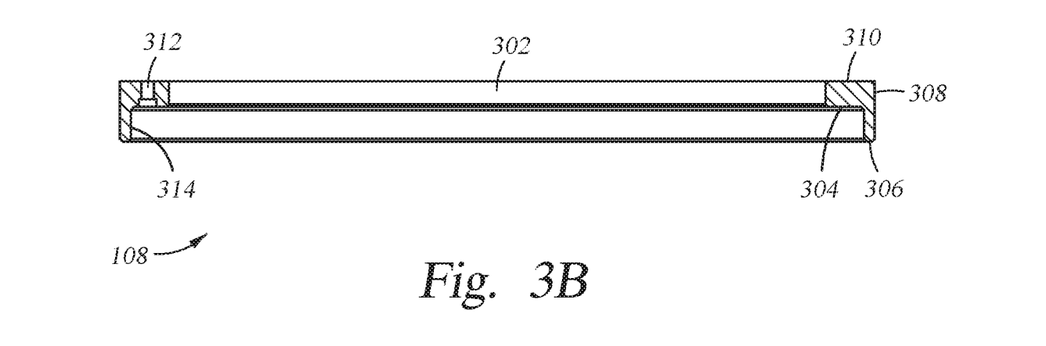
FIG. 3B illustrates a cross-sectional view of the showerhead liner of FIG. 3A taken along line 3B-3B according to one implementation described herein.

FIG. 3B illustrates a cross-sectional view of the showerhead liner 108 of FIG. 3A taken along line 3B-3B according to one implementation described herein. The showerhead line 108 includes a first surface 310 and a second surface 308 which is disposed normally to and extends from the first surface 310. A third surface 306 is disposed normally to and extends radially inward form the second surface 308. In one implementation, the first surface 310 and the third surface are substantially parallel. A fourth surface 314 is disposed normally to and extend from the third surface 306 parallel to the second surface 308. A fifth surface 304 is disposed normally to and extends from the fourth surface 314. A sixth surface 302 is disposed normal to and extends from the fifth surface 304 to the first surface 310.

The first surface 310 may be disposed adjacent to and contact the showerhead 112 within the chamber 100. The second surface 308 may be disposed adjacent to and contact the pumping liner 150. The second surface 308 defined the outer diameter of the showerhead liner 108 and the second surface 308 may have a diameter less than an inner diameter of the pumping liner 150. The sixth surface 302 defined the inner diameter of the showerhead liner 108 and the sixth surface 302 may be disposed radially outward of the first passages 121. One or more holes 312 may be formed in the showerhead liner 108 and extend between the first surface 310 and the fifth surface 304. The holes 312 may provide for coupling apparatus, such as screws or the like, to secure the showerhead liner 108 to the showerhead 112.

Figure 4:
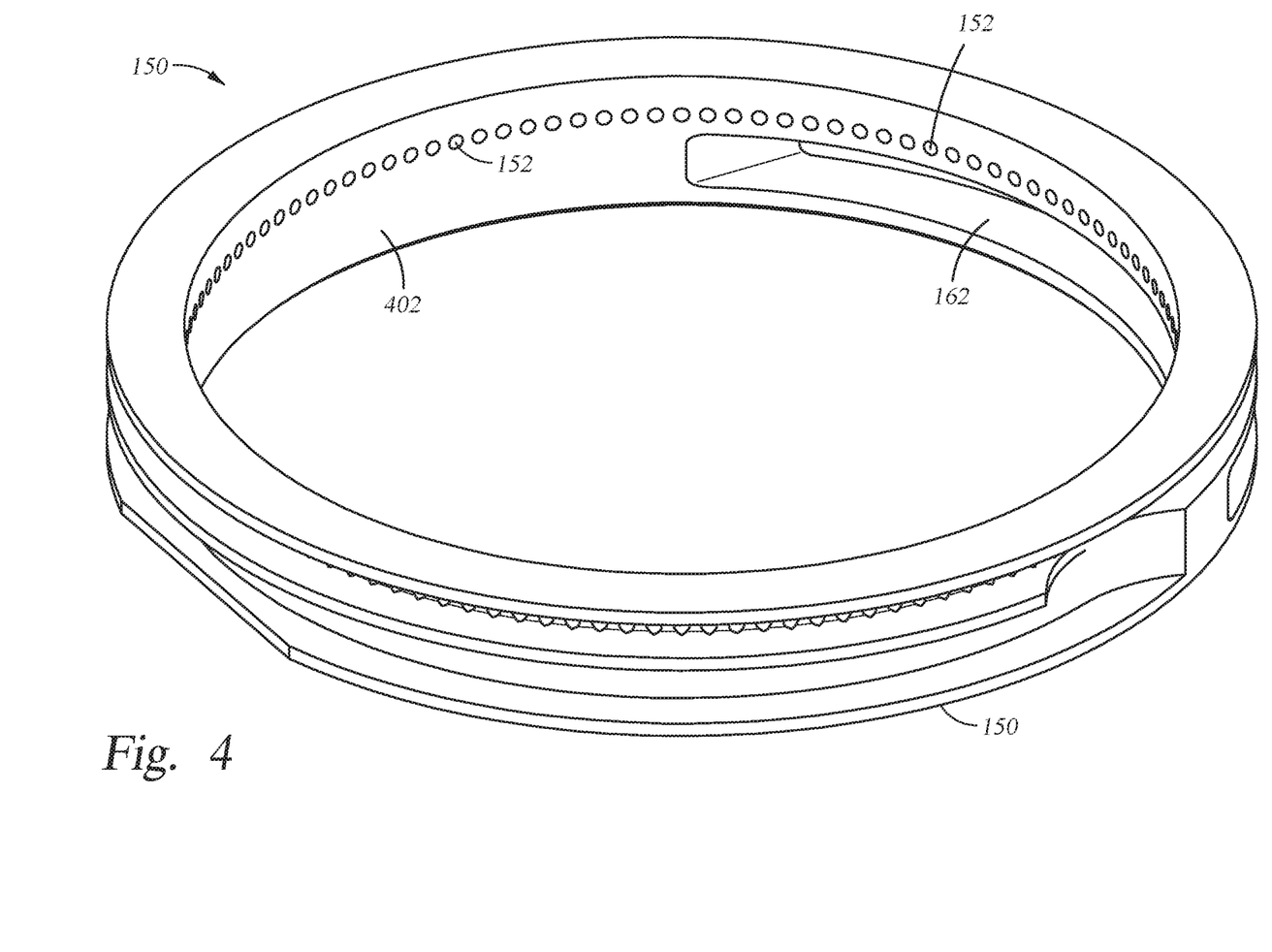
FIG. 4 illustrates a perspective view of a pumping liner of the processing chamber of FIG. 1 according to one implementation described herein.

FIG. 4 illustrates a perspective view of the pumping liner 150 according to one implementation described herein. As illustrated the pumping liner 150 is predominantly ring-shaped. The opening 162 formed in the pumping liner 150 may extend along the circumference between about 25% and about 50% of the circumference. It is contemplated that the opening 162 may be sufficiently sized to allow for passage of a substrate and robot transfer blade therethrough. The holes 152 may be disposed along an inner surface 402 which defined the inner diameter of the pumping liner 150 and the holes 152 may extend through the pumping liner 150 to an outer diameter a portion of the pumping liner 150. Although not illustrated, the holes 152 extend completely through the pumping liner 150 which is more clearly illustrated in FIG. 1.

Figure 5A:
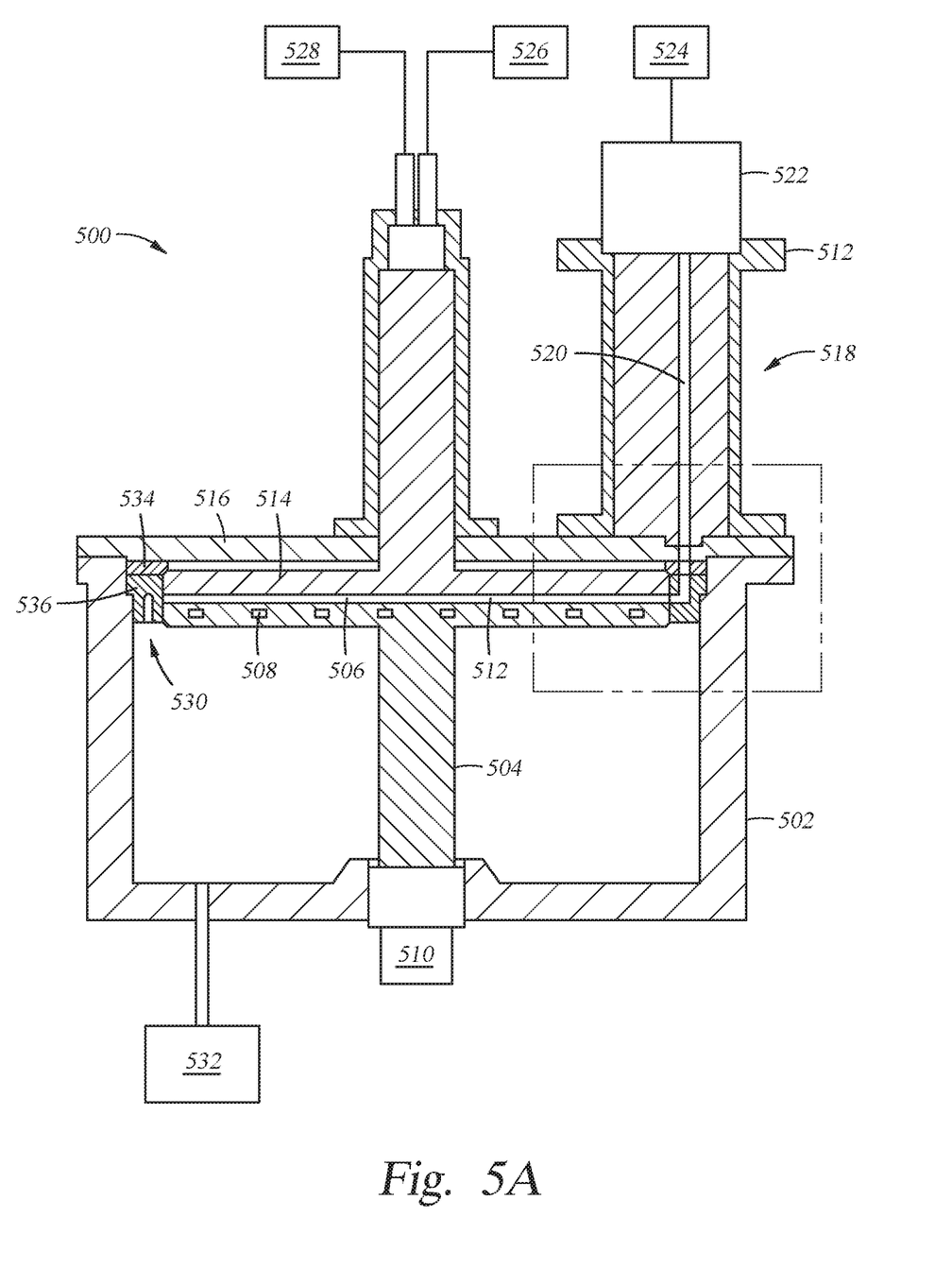
FIG. 5A illustrates a cross-sectional view of a processing chamber according to one implementation described herein.

FIG. 5A illustrates a cross-sectional view of a processing chamber 500 according to one implementation described herein. The chamber 500 includes a chamber body 502 which defines a process volume 506. A substrate support 504 may be disposed within the process volume 506 and a heater 514 may be disposed in the process volume 506 opposite the substrate support 504. A lid plate 516 may be coupled to the chamber body 502 and a vapor generation assembly 518 may be coupled to the lid plate 516.

The chamber body 502 may be formed from the same or similar materials as the chamber body 102. Similarly, the substrate support 504 may be formed from the same or similar materials as the substrate support 104. The substrate support 504 includes a heating member 508 disposed therein. The heating member 508 may be coupled to a power source 510 and be configured to heat the substrate support 504 to temperatures between about 100° C. and about 500° C.

The heater 514, which is disposed opposite the substrate support 504, may further define the process volume 506 between the heater 514 and the substrate support 504. The heater 514 may be coupled to a power source 528 and be configured to heat the heater 514 to temperatures between about 100° C. and about 500° C. A temperature of the process volume 506 may be maintained during processing at a temperature of between about 50° C. and about 500° C., such as between about 100° C. and about 250° C. A gas source 526 may also be coupled to the heater 514 and the gas source 526 may be in fluid communication with the process volume 506. In one implementation, the gas source 526 may be configured to deliver a co-reactant precursor to the process volume 506. Alternatively, the gas source 526 may be configured to deliver a purge gas, a carrier gas, or a cleaning gas to the process volume 506, depending on the desired implementation.

The vapor generation assembly 518, such as a vaporizer, a direct liquid injection vaporizer or the like, may be coupled to the lid plate 516. The vapor generation assembly 518 is coupled to the lid plate 516 radially outward of the process volume 506. The position of the vapor generation assembly 518, and injection location of vapor to the process volume 506, provides for a cross-flow type exposure of a substrate to SAM precursors. The vapor generation assembly 518 includes a vaporizer 522 and an injector 520 extending from the vaporizer 522. The vaporizer 522 may be coupled to a SAM precursor source 524 and receive SAM precursors in liquid form for vaporization. The vaporizer 522 may be maintained at a temperature of between about 100° C. and about 500° C. to vaporize the SAM precursor and the temperature of the vaporizer 522 may be determine, at least in part, by the vapor pressure of the SAM precursor.

Vaporized SAM precursor may exit the vaporizer 522 and travel through the injector 520. The injector 520 extends from the vaporizer 522 through the vapor generation assembly 518, which may be maintained at an elevated temperature by a heater jacket 512 to maintain the SAM precursor in a vapor state, and to the lid plate 516. While a single injector is illustrated, additional injectors, such as illustrated in FIG. 6 are contemplated. The SAM precursor travel path will be discussed in greater detail with regard to FIG. 5B.

A manifold 536 may be coupled to the chamber body 502 radially outward of the substrate support 504 and the heater 514. The manifold 536 may be formed from the same of similar materials as the substrate support 504 and the heater 514. The manifold 536 is sized to circumscribe the process volume 506 such that an inner diameter of the manifold 536 is larger than an outer diameter of the substrate support 504 and an outer diameter of the heater 514. Vapor may flow through the manifold 536 from the injector 520 to an outlet 530 disposed opposite the injector 520. An exhaust 532 may also be coupled to and in fluid communication with the process volume 506. More specifically, the exhaust 532 may be in fluid communication with the process volume 506 via the outlet 530. Accordingly, process volume effluent may be evacuated from the process volume 506 through the outlet 530 to the exhaust 532.

A thermal insulator 534 may be coupled to the lid plate 516 radially outward of the heater 514. The thermal insulator 534 may be sized similarly to the manifold 536 and may be disposed between the manifold 536 and the lid plate 516. The thermal insulator 534 may also be coupled to or in contact with the chamber body 502. The thermal insulator 534 may be formed from a thermally insulative material, such as a ceramic material or the like, configured to reduce of prevent the conduction of heat from the substrate support 504, the heater 514, and the manifold 536 from to the lid plate 516. In one implementation, the thermal insulator 534 may be optional. In this implementation, an air gap may function as a thermal break between the lid plate 516 and the substrate support 504, the heater 514, and the manifold 536.

Figure 5B:
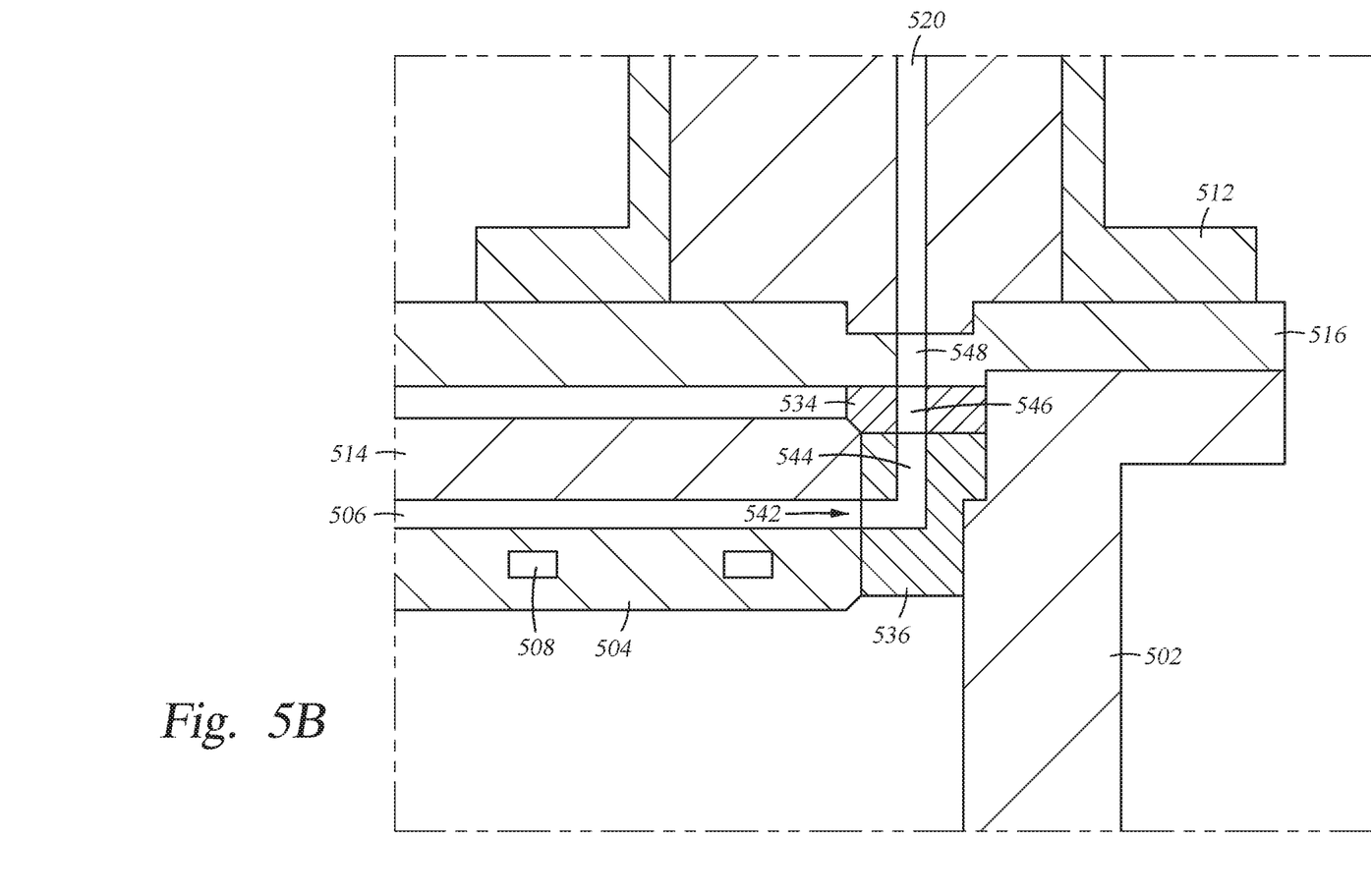
FIG. 5B illustrates an enlarged portion of the processing chamber of FIG. 5A according to one implementation described herein.
Figure 6:
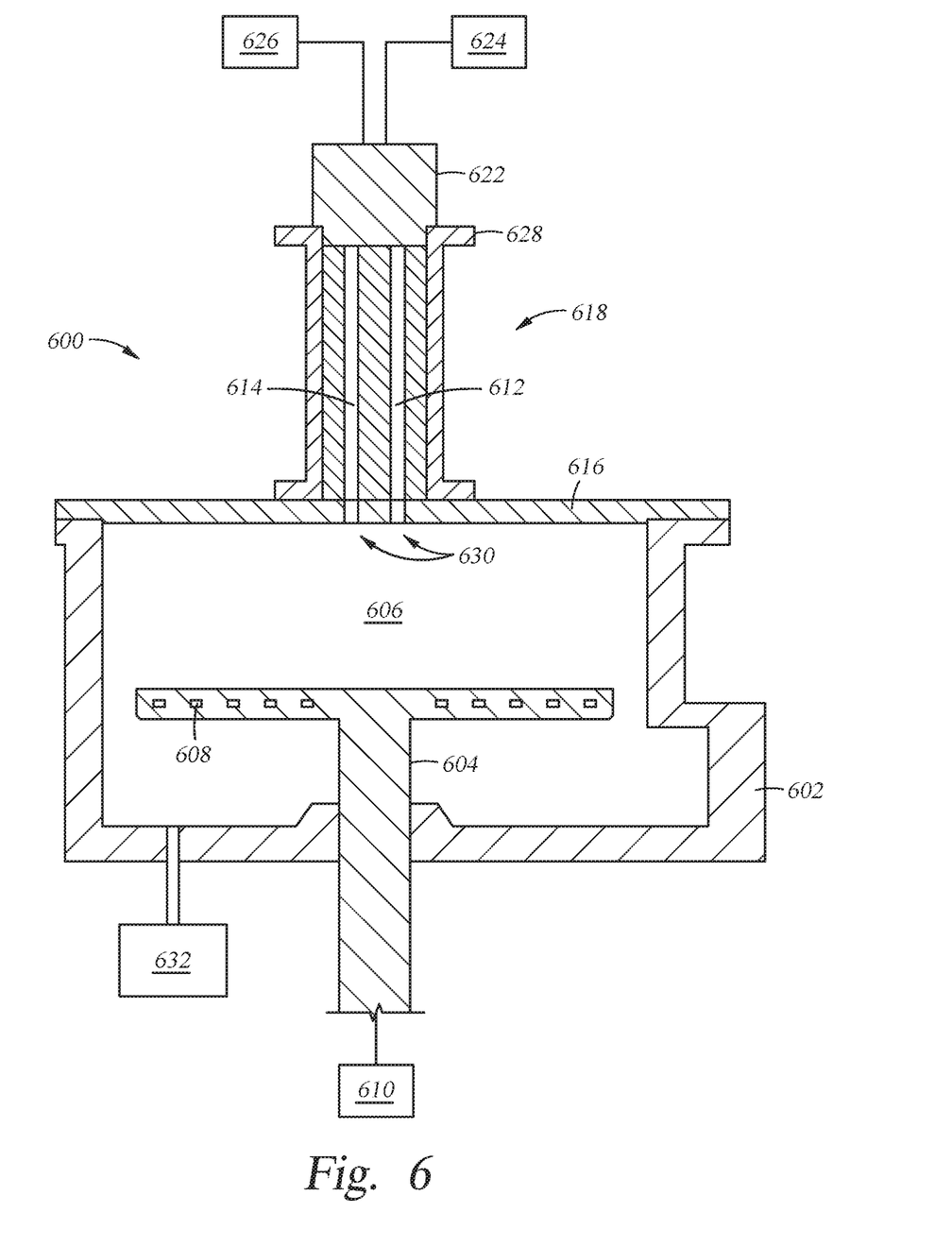
FIG. 6 illustrates a cross-sectional view of a processing chamber according to one implementation described herein.

FIG. 5B illustrates an enlarged portion of the processing chamber 500 of FIG. 5A according to one implementation described herein. The injector 520 extends to the lid plate 516 adjacent a first channel 548 formed in the lid plate 516. A second channel 546 may be formed in the thermal insulator 534 adjacent to and aligned with the first channel 548. A third channel 544 may be formed in the manifold 536 adjacent to and aligned with the second channel 546. The third channel 544 may extend from the second channel 546 of the thermal insulator 534 to an outlet 542 disposed adjacent the process volume 506. The outlet 542 may be positioned such that vapor provided from the vapor generation assembly 518 enters the process volume 506 between the substrate support 504 and the heater 514 when the substrate support 504 is in an elevated process position. Accordingly, vapor from the vapor generation assembly 518 travels through the injector 520, the first channel 548, the second channel 546, and the third channel 544, and through the outlet 542 to the process volume 506.

Figure 5C:
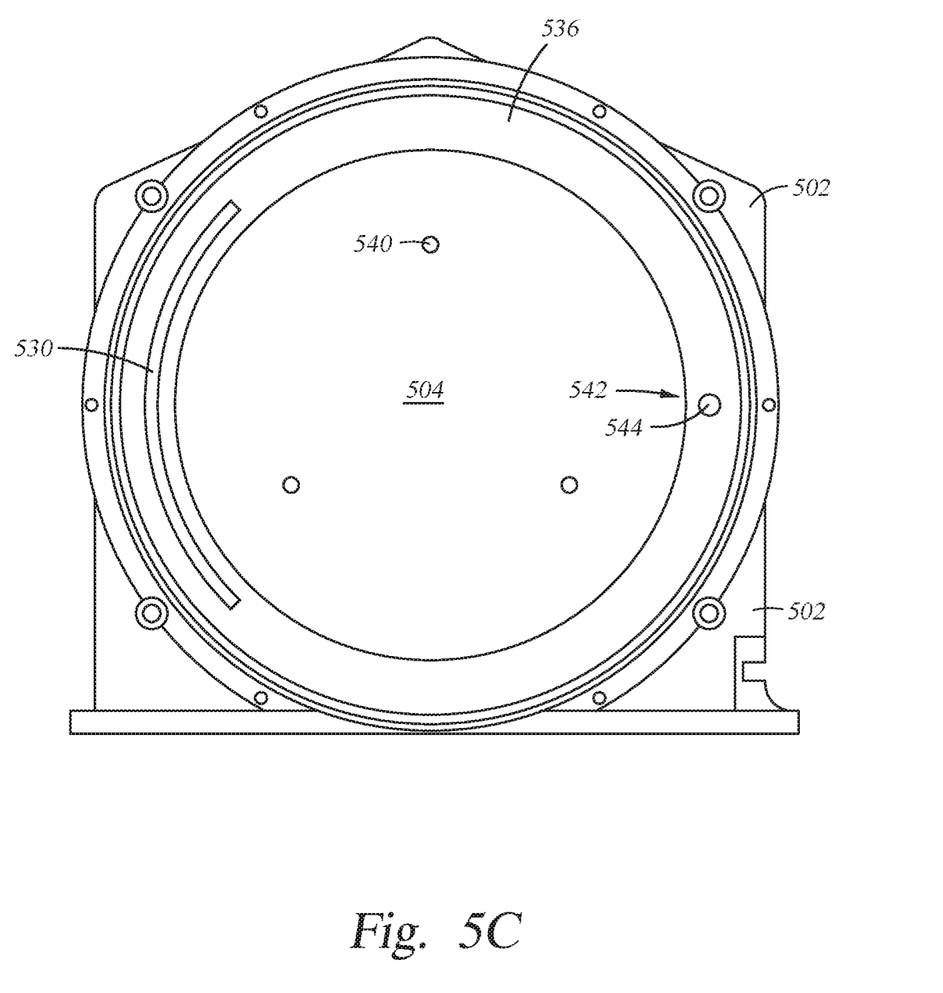
FIG. 5C illustrates a plan view of a substrate support and a manifold of the processing chamber of FIG. 5A according to one implementation described herein.

FIG. 5C illustrates a plan view of the substrate support 504 and the manifold 536 of the processing chamber 500 of FIG. 5A according to one implementation described herein. As illustrated, the third channel 544 and outlet 542 are disposed opposite the outlet 530. Accordingly, vapor exiting the outlet 542 travels across a substrate disposed on the substrate support 504 to the outlet 530. The outlet 530 may be formed in the manifold 536 and extend curvilinearly a distance less than one half of the circumference of the manifold 536. A plurality of holes 540 may also be formed in the substrate support 504 to allow for lift pins to extend therethrough.

FIG. 6 illustrates a cross-sectional view of a processing chamber 600 according to one implementation described herein. The chamber 600 includes a chamber body 602 which defines a process volume 606. A substrate support 604 may be disposed within the process volume 606 and a lid plate 616 may be coupled to the chamber body 602 opposite the substrate support 604. A vapor generation assembly 618 may be coupled to the lid plate 616.

The chamber body 602 may be formed from the same or similar materials as the chamber body 502. Similarly, the substrate support 604 may be formed from the same or similar materials as the substrate support 504. The substrate support 604 includes a heating member 608 disposed therein. The heating member 608 may be coupled to a power source 610 and be configured to heat the substrate support 604 to temperatures between about 100° C. and about 500° C.

The vapor generation assembly 618, such as a vaporizer, a direct liquid injection vaporizer or the like, may be coupled to the lid plate 616 adjacent a center of the process volume 606. The position of the vapor generation assembly 618, and injection location of vapor to the process volume 606, provides for a top-down type exposure of a substrate to SAM precursors. The vapor generation assembly 618 includes a vaporizer 622 and one or more injectors 612, 614 extending from the vaporizer 622. The vaporizer 622 may be coupled to a SAM precursor source 624 and receive SAM precursors in liquid form for vaporization. The vaporizer 622 may be maintained at a temperature of between about 100° C. and about 500° C. to vaporize the SAM precursor and the temperature of the vaporizer 622 may be determine, at least in part, by the vapor pressure of the SAM precursor.

Vaporized SAM precursor may exit the vaporizer 622 and travel through one or both of the injectors 612, 614. The injectors 612, 614 extend from the vaporizer 622 through the vapor generation assembly 618, which may be maintained at an elevated temperature by a heater jacket 628 to maintain the SAM precursor in a vapor state, and to the lid plate 616. In one implementation, SAM precursor from the source 624 may be introduced to the process volume via the injector 612 through an outlet 630. A gas source 626 may also be in fluid communication with the process volume 606. The gas source 626 may introduce a liquid or gas to the vapor generation assembly 618 and the generated vapor may be introduced to the process volume 606 via the injector 614 and the outlet 630. In one implementation, the gas source 626 may provide a co-reactant precursor. In another implementation, the gas source 626 may provide a purge gas, a carrier gas, or a cleaning gas, depending upon the desired implementation.

The process volume 606 may also be in fluid communication with an exhaust 632. Accordingly, process volume effluent may be evacuated from the process volume 606 via the exhaust 632. Both chambers 500 and 600 may be maintained at a pressure of less than about 600 Torr. Processes performed in the chambers 500, 600 may be isobaric or non-isobaric. Similarly, the processes performed in the chambers 500, 600 may be isothermal or non-isothermal.

While the foregoing is directed to implementations of the present disclosure, other and further implementations of the disclosure may be devised without departing from the basic scope thereof, and the scope thereof is determined by the claims that follow.

What is claimed is:

1. A substrate processing apparatus, comprising:
   a chamber body defining a process volume;
   a substrate support disposed within the process volume;
   a showerhead disposed opposite the substrate support;
   a lid plate coupled to the chamber body;
   a backing plate disposed between the lid plate and the showerhead;
   an injection assembly coupled to the lid plate opposite the backing plate, wherein the injection assembly is in fluid communication with the process volume via the backing plate and the showerhead;

a first vapor generation assembly in fluid communication with the injection assembly, wherein the first vapor generation assembly is an ampoule or a direct liquid injection vaporizer, wherein the first vapor generation assembly is configured to deliver a self-assembled monolayer (SAM) precursor to the process volume in a vapor state;

a first heated delivery conduit disposed between the first vapor generation assembly and the injection assembly;

a second vapor generation assembly in fluid communication with the injection assembly, wherein the second vapor generation assembly is an ampoule or a direct liquid injection vaporizer, wherein the second vapor generation assembly is configured to deliver a co-reactant to the process volume in a vapor state;

a second heated delivery conduit disposed between the second vapor generation assembly and the injection assembly;

a showerhead liner coupled to the showerhead opposite the substrate support, wherein the showerhead liner is configured to reduce a volume of the process volume, the material of the showerhead and the material of the showerhead liner comprising the same material, the showerhead liner comprises a first annular portion having a first inner circumference and a first annular surface facing the showerhead, and a second annular portion having a second inner circumference which extends from the first annular portion in the direction away from the showerhead, and an inner circumferential surface which terminates at a second annular surface facing away from the first annular surface such that a gap is formed between the second annular surface and the outer surface of the substrate support when the substrate support is in the processing position, and an outer circumferential surface extending from the first annular surface to the second annular surface, the showerhead liner, the substrate support and the portion of the showerhead facing the substrate support within the first inner circumference of the showerhead liner delimit the reduced processing volume when the substrate support is in a substrate processing position; and a pumping liner disposed radially about the substrate support, and including a inwardly facing circumferential surface and wherein openings in the pumping liner extend through the pumping liner from the inwardly facing circumferential surface of the pumping liner and are in fluid communication with the reduced processing volume through a gap between the outer circumference of the substrate support and the second annular surface of the showerhead liner, and in fluid communication with a chamber exhaust, to define an gas exhaust flow path so that unused (SAM) precursor flows over the edges of the substrate support through the gap disposed between the second annular surface of the showerhead liner and a circumferential surface of the substrate support to the openings in the pumping liner, wherein the outer circumferential surface of the showerhead liner, from the first annular portion to the second annular portion, faces the inwardly facing surface of the pumping liner.

2. The apparatus of claim 1, wherein the showerhead has a heater disposed therein and the heater is coupled to a power source.

3. The apparatus of claim 2, wherein the heater is a resistive heating element.

4. The apparatus of claim 2, wherein the backing plate is positioned adjacent the showerhead to provide for conductive heating of the backing plate via proximity to the showerhead.

5. The apparatus of claim 1, further comprising:
a cleaning gas source in fluid communication with the injection assembly.

6. The apparatus of claim 5, further comprising:
an RF power source coupled to one or more of the injection assembly, the lid plate, the backing plate, and the showerhead, the RF power source configured to generate plasma products from a gas provided by the cleaning gas source.

7. The apparatus of claim 1, wherein the injection assembly, the backing plate, and the showerhead are formed from a material selected from the group consisting of aluminum, aluminum alloys, stainless steel, aluminum oxide, and aluminum nitride.

8. The apparatus of claim 1, wherein the first heated delivery line and the second heated delivery line are jacketed with heater assemblies.

9. The apparatus of claim 1, wherein the first vapor generation assembly and the second vapor generation assembly are configured to vaporize a liquid at temperatures between about 50° C. and about 200° C.

10. The apparatus of claim 1, wherein the SAM precursor is selected from the group consisting of phosphonic acid materials, thiol materials, silylamine materials, chlorosilane materials, oxysilane materials, and combinations thereof.

11. The apparatus of claim 1, wherein the co-reactant is selected from the group consisting of ambient air, water vapor, hydrogen peroxide vapor, organic alcohol vapors, oxygen gas, and hydrogen gas.

12. A substrate processing apparatus, comprising:
a chamber body defining a process volume;
a substrate support disposed within the process volume;
a showerhead disposed opposite the substrate support;
a lid plate coupled to the chamber body;
a backing plate disposed between the lid plate and the showerhead;
an injection assembly coupled to the lid plate opposite the backing plate, wherein the injection assembly is in fluid communication with the process volume via the backing plate and the showerhead;
a first vapor generation assembly in fluid communication with the injection assembly, wherein the first vapor generation assembly is an ampoule or a direct liquid injection vaporizer, wherein the first vapor generation assembly is configured to deliver a self-assembled monolayer (SAM) precursor to the process volume in a vapor state;
a first heated delivery conduit disposed between the first vapor generation assembly and the injection assembly;
a second vapor generation assembly in fluid communication with the injection assembly, wherein the second vapor generation assembly is an ampoule or a direct liquid injection vaporizer, wherein the second vapor generation assembly is configured to deliver a co-reactant to the process volume in a vapor state; and
a second heated delivery conduit disposed between the second vapor generation assembly and the injection assembly; and
a showerhead liner coupled to the showerhead and facing the substrate support, the showerhead liner comprising of a first annular portion having a first inner circumference and a second annular portion having a second inner circumference and extending from the first annular portion in the direction away from the showerhead, wherein a portion of the substrate support, in a substrate processing position, is surrounded by a portion of the second annular portion of the showerhead liner and the showerhead liner is configured to reduce a volume of the process volume, the material of the showerhead and the material of the showerhead liner comprising the same material;

the showerhead liner comprises a first annular portion having a first inner circumference and a first annular surface facing the showerhead, and a second annular portion having a second inner circumference which extends from the first annular portion in the direction away from the showerhead, and an inner circumferential surface which terminates at a second annular surface facing away from the first annular surface such that a gap is formed between the second annular surface and the outer surface of the substrate support when the substrate support is in the processing position, and an outer circumferential surface extending from the first annular surface to the second annular surface, the showerhead liner, the substrate support and the portion of the showerhead facing the substrate support within the first inner circumference of the showerhead liner delimit the reduced processing volume when the substrate support is in a substrate processing position; and a pumping liner disposed radially about the substrate support, and including a inwardly facing circumferential surface and wherein openings in the pumping liner extend through the pumping liner from the inwardly facing circumferential surface of the pumping liner and are in fluid communication with the reduced processing volume through a gap between the outer circumference of the substrate support and the second annular surface of the showerhead liner, and in fluid communication with a chamber exhaust, to define an gas exhaust flow path so that unused (SAM) precursor flows over the edges of the substrate support through the gap disposed between the second annular surface of the showerhead liner and a circumferential surface of the substrate support to the openings in the pumping liner, wherein the outer circumferential surface of the showerhead liner, from the first annular portion to the second annular portion, faces the inwardly facing surface of the pumping liner.

13. The apparatus of claim 12, wherein the showerhead has a heater disposed therein and the heater is coupled to a power source.

14. The apparatus of claim 13, wherein the heater is a resistive heating element.

* * * * *